(12) United States Patent
Zhang

(10) Patent No.: US 11,962,309 B2
(45) Date of Patent: Apr. 16, 2024

(54) PHASE ADJUSTING CIRCUIT, DELAY LOCKING CIRCUIT, AND MEMORY

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 18/169,285

(22) Filed: Feb. 15, 2023

(65) Prior Publication Data

US 2023/0396256 A1 Dec. 7, 2023

Related U.S. Application Data

(63) Continuation of application No. PCT/CN2022/101472, filed on Jun. 27, 2022.

(30) Foreign Application Priority Data

Jun. 6, 2022 (CN) .......................... 202210633611.4

(51) Int. Cl.
*H03L 7/081* (2006.01)
*H03L 7/087* (2006.01)
*H03L 7/091* (2006.01)

(52) U.S. Cl.
CPC ............ *H03L 7/0814* (2013.01); *H03L 7/087* (2013.01); *H03L 7/091* (2013.01)

(58) Field of Classification Search
CPC ........ H03L 7/0814; H03L 7/087; H03L 7/091
See application file for complete search history.

(56) References Cited

U.S. PATENT DOCUMENTS 4,987,387 A * 1/1991 Kennedy ................. H03L 7/093
  331/25
10,574,241 B2 * 2/2020 Wei ........................ G11C 7/1066
(Continued)

FOREIGN PATENT DOCUMENTS

CN 103944568 A 7/2014
CN 110827872 A 2/2020
(Continued)

OTHER PUBLICATIONS

Supplementary Partiai European Search Report in the European application No. 22847397.1, mailed on Feb. 23, 2024. 11 pages.

*Primary Examiner* — Adam D Houston
(74) *Attorney, Agent, or Firm* — Cooper Legal Group, LLC

(57) ABSTRACT

A phase adjusting circuit, a delay locking circuit, and a memory are provided. The phase adjusting circuit includes a detection circuit, a comparison circuit, a counter, and an adjustment circuit that are connected in sequence. The detection circuit is configured to detect a phase difference between a first clock signal and a second clock signal to obtain a first detection signal and a second detection signal. The comparison circuit is configured to perform duty cycle comparison of the first detection signal and the second detection signal to obtain a counting indication signal. The counter is configured to count a number of pulses of a preset counting clock signal based on the counting indication signal to obtain a count value. The adjustment circuit is configured to perform phase adjustment of the second clock signal based on the count value, so that the phase difference is a preset value.

19 Claims, 8 Drawing Sheets

(56) References Cited

U.S. PATENT DOCUMENTS

| | | |
|---|---|---|
| 2007/0069776 A1 | 3/2007 | Hur |
| 2008/0191768 A1 | 8/2008 | Miki |
| 2009/0045858 A1 | 2/2009 | Hur |
| 2009/0168552 A1 | 7/2009 | Yoon |
| 2011/0234270 A1* | 9/2011 | Kobayashi ............... H03L 7/07 327/156 |
| 2016/0380638 A1* | 12/2016 | Kumazawa ........... H03L 7/0814 375/354 |
| 2019/0198075 A1 | 6/2019 | Lee |
| 2020/0059226 A1* | 2/2020 | Choi ................... H03K 5/1565 |
| 2020/0336148 A1 | 10/2020 | Im |
| 2021/0021271 A1* | 1/2021 | Chen ......................... H03L 7/07 |
| 2021/0174850 A1 | 6/2021 | Han et al. |
| 2022/0006461 A1* | 1/2022 | Choi .................... H03L 7/0814 |
| 2022/0052678 A1 | 2/2022 | Choi et al. |
| 2022/0321112 A1 | 10/2022 | Choi et al. |
| 2023/0029968 A1* | 2/2023 | Chang .................... G11C 7/222 |
| 2023/0307022 A1* | 9/2023 | Yoon ................... G11C 7/1057 |
| 2023/0327429 A1* | 10/2023 | Chen ...................... H02H 9/046 361/56 |
| 2023/0336164 A1* | 10/2023 | Park ..................... H03K 5/1565 |
| 2023/0396256 A1* | 12/2023 | Zhang .................. H03L 7/0814 |

FOREIGN PATENT DOCUMENTS

| | | | |
|---|---|---|---|
| CN | 112908375 A | 6/2021 | |
| EP | 1626502 A1 * | 2/2006 | ......... G11B 20/1426 |

\* cited by examiner

PHASE ADJUSTING CIRCUIT, DELAY LOCKING CIRCUIT, AND MEMORY

CROSS-REFERENCE TO RELATED APPLICATION

This application is a continuation of International Patent Application No. PCT/CN2022/101472, filed on Jun. 27, 2022, which is based upon and claims priority to Chinese Patent Application No. 202210633611.4, filed on Jun. 6, 2022. The contents of International Patent Application No. PCT/CN2022/101472 and Chinese Patent Application No. 202210633611.4 are hereby incorporated by reference in their entireties.

BACKGROUND

A Delay Loop Lock (DLL) has four clock paths with phases differing by 90 degrees in sequence in a Dynamic Random Access Memory (DRAM). However, these four clock paths may cause the problems of mismatch and noise due to phase skew, thereby affecting the performance of the memory.

SUMMARY

The present disclosure relates to the field of semiconductor memory technologies, and provides a phase adjusting circuit, a delay locking circuit, and a memory.

In a first aspect, the embodiments of the present disclosure provide a phase adjusting circuit. The phase adjusting circuit includes a detection circuit, a comparison circuit, a counter, and an adjustment circuit that are connected in sequence.

The detection circuit is configured to detect a phase difference between a first clock signal and a second clock signal to obtain a first detection signal and a second detection signal.

The comparison circuit is configured to perform duty cycle comparison of the first detection signal and the second detection signal to obtain a counting indication signal.

The counter is configured to count a number of pulses of a preset counting clock signal based on the counting indication signal to obtain a count value.

The adjustment circuit is configured to perform phase adjustment of the second clock signal based on the count value, so that the phase difference between the first clock signal and the second clock signal is a preset value.

In a second aspect, the embodiments of the present disclosure provide a delay locking circuit. The delay locking circuit is configured to output a first clock signal, a second clock signal, a third clock signal, and a fourth clock signal. The delay locking circuit includes at least the phase adjusting circuit in the first aspect. Herein, the delay locking circuit is configured to correct phase differences between the first clock signal, the second clock signal, the third clock signal, and the fourth clock signal through the phase adjusting circuit, so that the first clock signal, the second clock signal, the third clock signal, and the fourth clock signal differ in phase by 90 degrees in sequence.

In a third aspect, the embodiments of the present disclosure provide a memory. The memory includes at least the delay locking circuit in the second aspect.

DETAILED DESCRIPTION

Figure 1:
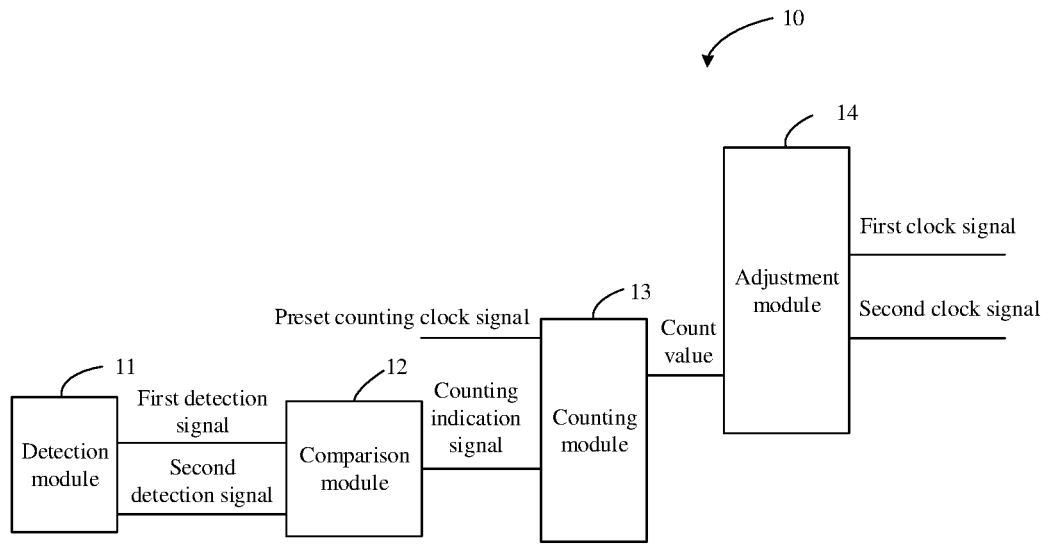
FIG. 1 is a structural diagram of a phase adjusting circuit according to an embodiment of the present disclosure.

The technical solutions in the embodiments of the present disclosure will be clearly and completely described in conjunction with the drawings in the embodiments of the present disclosure. It should be understood that that the specific embodiments described herein are only used to illustrate the present disclosure, but are not intended to limit the present disclosure. In addition, it is to be noted that for the convenience of description, only the parts related to the present disclosure are shown in the drawings.

Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first/second/third" involved in the embodiments of the present disclosure are only used to distinguish similar objects, and do not represent a specific order of the objects. It should be understood that the specific order or sequence of "first/second/third" may be interchangeable under the allowable circumstances, so that the embodiments of the disclosure described herein may be implemented in an order other than those illustrated or described herein.

A DLL has four main clock paths in a memory. Theoretically, the phases of the four clock paths differ by 90 degrees in sequence, for subsequent sampling or data processing.

However, there may be phase skew between the clock paths, which causes the problems of mismatch and noise, thereby affecting the performance of the memory.

Based on this, the embodiments of the present disclosure provide a phase adjusting circuit. The phase adjusting circuit includes: a detection module, configured to detect a phase difference between a first clock signal and a second clock signal to obtain a first detection signal and a second detection signal; a comparison module, configured to perform duty cycle comparison of the first detection signal and the second detection signal to obtain a counting indication signal; a counting module, configured to count the number of pulses of a preset counting clock signal based on the counting indication signal to obtain a count value; and an adjustment module, configured to perform phase adjustment of the second clock signal based on the count value, so that the phase difference between the first clock signal and the second clock signal is a preset value. In this way, by detecting the phase difference between different clock signals and correcting the clock signals, the phase skew between the clock signals is improved.

The embodiments of the present disclosure will be described in detail below with reference to the accompanying drawings.

In an embodiment of the present disclosure, referring to FIG. 1, which shows a structural diagram of a phase adjusting circuit 10 according to an embodiment of the present disclosure. As shown in FIG. 1, the phase adjusting circuit 10 includes a detection module 11, a comparison module 12, a counting module 13, and an adjustment module 14 that are connected in sequence.

The detection module 11 is configured to detect a phase difference between a first clock signal and a second clock signal to obtain a first detection signal and a second detection signal.

The comparison module 12 is configured to perform duty cycle comparison of the first detection signal and the second detection signal to obtain a counting indication signal.

The counting module 13 is configured to count the number of pulses of a preset counting clock signal based on the counting indication signal to obtain a count value.

The adjustment module 14 is configured to perform phase adjustment of the second clock signal based on the count value, so that the phase difference between the first clock signal and the second clock signal is a preset value.

It is to be noted that the phase adjusting circuit 10 of the embodiment of the present disclosure may be applied to a memory, such as a DRAM and a Synchronous Dynamic Random Access Memory (SDRAM), to adjust the phase difference between different clock signals.

It should be understood that the preset value may be a preset range considering an allowable error range. In the memory, the preset value is generally 90 degrees. That is to say, the phase difference between the first clock signal and the second clock signal is the preset value, which means that the phase difference between the first clock signal which is subjected to phase delay of 90 degrees and the second clock signal is within the allowable error range. In the following, when reference is made to the phase difference between different signals, it refers to that the phase difference is within the preset range considering the allowable error range.

In this way, in a case that the second clock signal has phase skew, the phase adjusting circuit 10 may perform phase adjustment of the second clock signal, so as to ensure that the phase of the second clock signal is delayed by 90 degrees compared to the phase of the first clock signal within the allowable error range, thereby improving the accuracy of the clock signal.

In practical application, the memory may also involve a third clock signal and a fourth clock signal, a phase difference between the third clock signal and the first clock signal is 180 degrees, and a phase difference between the fourth clock signal and the second clock signal is 180 degrees.

In some embodiments, the adjustment module 14 is further configured to perform phase adjustment of the fourth clock signal based on the count value, so that the phase difference between the third clock signal and the fourth clock signal is the preset value.

It should be understood that since the third clock signal and the first clock signal are a pair of signals with opposite phases, it can be considered that the third clock signal falls behind the first clock signal by fixed 180 degrees in phase, and there is no need to adjust the phase of the third clock signal. Similarly, it can be considered that the fourth clock signal falls behind the second clock signal by fixed 180 degrees in phase, so that the fourth clock signal and the second clock signal may be adjusted synchronously, and phase adjustment of the fourth clock signal is also performed based on the aforementioned count value.

In this way, the phase adjusting circuit 10 may perform phase adjustment of a group of four-phase clock signals to cancel the phase skew between the clock signals, so as to ensure that the first clock signal, the second clock signal, the third clock signal, and the fourth clock signal differ in phase by 90 degrees in sequence within the allowable error range, which improves the problem of mismatch and noise, and improves the performance of the memory.

In addition, upon detecting that the phase difference between the first clock signal and the second clock signal (as well as the third clock signal and the fourth clock signal) has met the expectation, the count value may be latched to maintain this state.

It is to be noted that the first detection signal is configured to indicate a phase difference between a rising edge of the first clock signal and a rising edge of the second clock signal, and the second detection signal is configured to indicate a phase difference between the rising edge of the second clock signal and a falling edge of the first clock signal. Specifically, in some embodiments, the detection module 11 is configured to receive any three signals of the first clock signal, the second clock signal, the third clock signal, and the fourth clock signal, and output the first detection signal and the second detection signal based on the received signals.

Figure 2:
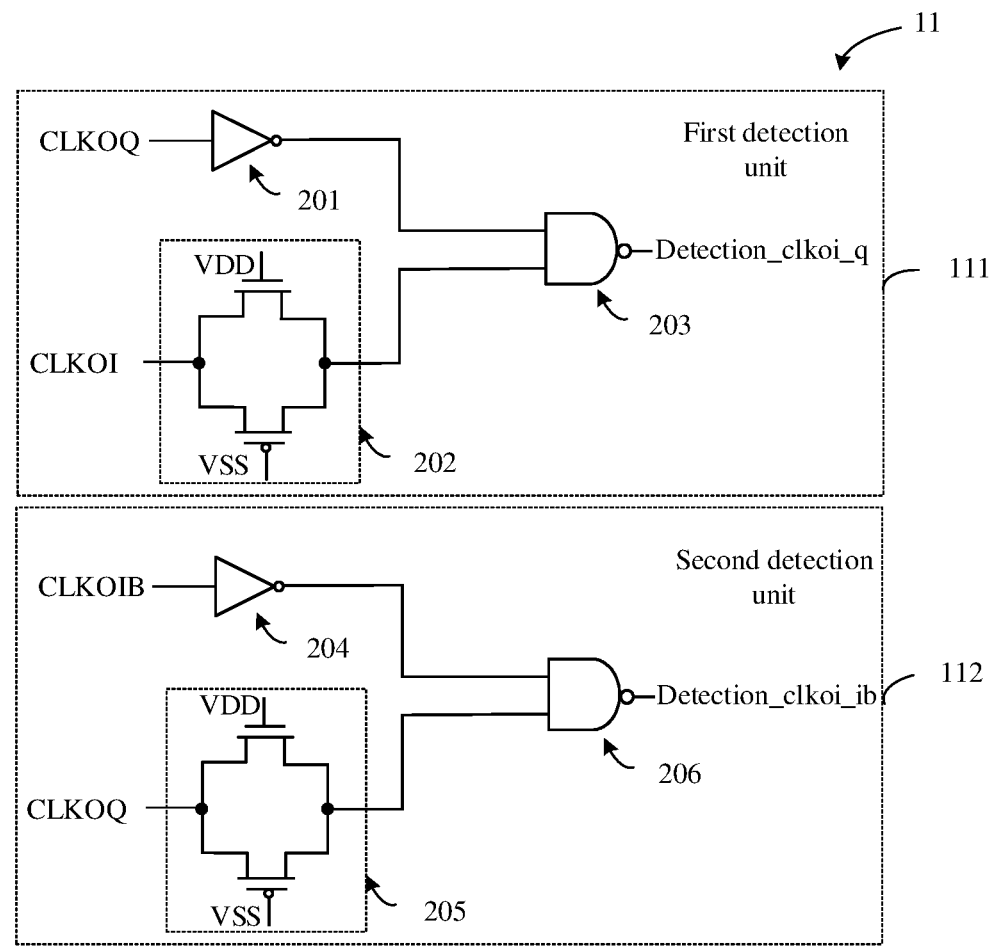
FIG. 2 is a first diagram of a partial structure of a phase adjusting circuit according to an embodiment of the present disclosure.

In the following, assuming that the detection module 11 is configured to receive the first clock signal CLKOI, the second clock signal CLKOQ and the third clock signal CLKOIB, and a specific structure of the detection module 11 is provided. As shown in FIG. 2, the detection module 11 may include a first detection unit 111 and a second detection unit 112.

The first detection unit 111 is configured to receive the first clock signal CLKOI and the second clock signal CLKOQ, and perform logical operation of the first clock signal CLKOI and the second clock signal CLKOQ to obtain the first detection signal Detection_clkoi_q.

The second detection unit 112 is configured to receive the third clock signal CLKOIB and the second clock signal CLKOQ, and perform logical operation of the third clock signal CLKOIB and the second clock signal CLKOQ to obtain the second detection signal Detection_clkoi_ib.

In some embodiments, the first detection unit 111 may include a first inverter 201, a first transmission gate 202, and a first NAND gate 203. The second detection unit 112 may include a second inverter 204, a second transmission gate 205, and a second NAND gate 206. An input terminal of the first inverter 201 is configured to receive the second clock signal CLKOQ, an input terminal of the first transmission gate 202 is configured to receive the first clock signal CLKOI, and two input terminals of the first NAND gate 203 are connected to an output terminal of the first inverter 201 and an output terminal of the first transmission gate 202 respectively, and an output terminal of the first NAND gate 203 is configured to output the first detection signal Detection_clkoi_q. An input terminal of the second inverter 204 is configured to receive the third clock signal CLKOIB, an input terminal of the second transmission gate 205 is configured to receive the second clock signal CLKOQ, and two input terminals of the second NAND gate 206 are connected to an output terminal of the second inverter 204 and an output terminal of the second transmission gate 205 respectively, and an output terminal of the second NAND gate 206 is configured to output the second detection signal Detection_clkoi_ib.

It is to be noted that both the first inverter 201 and the second inverter 204 may adopt conventional inverter structures. Exemplarily, the inverter may include an N-channel field effect transistor (N-Channel Metal Oxide Semiconductor (NMOS)) and a P-channel field effect transistor (P-Channel Metal Oxide Semiconductor (PMOS). Herein, a gate electrode of the NMOS and a gate electrode of the PMOS are connected to form the input terminal of the inverter, a drain electrode of the NMOS is configured to receive a power supply signal VDD, a drain electrode of the PMOS is configured to receive a ground signal VSS, and a source electrode of the NMOS and a source electrode of the PMOS are connected to form the output terminal of the inverter.

It should be understood that in the first detection unit 111, the second clock signal CLKOQ passes through the first inverter 201, to not only invert its phase but also produce a certain delay. Therefore, the first clock signal CLKOI passes through the first transmission gate 202 to produce the same delay, so that the first NAND gate 203 may synchronously perform NAND operation of the inverted signal of the second clock signal CLKOQ and the first clock signal CLKOI to obtain the first detection signal Detection_clkoi_q. The function of the second transmission gate 205 may be understood by reference.

Both the first transmission gate 202 and the second transmission gate 205 may adopt conventional transmission gate structures. As shown in FIG. 2, the transmission gate may include an NMOS and a PMOS. Herein, a gate electrode of the NMOS is connected to the power supply signal VDD, and a gate electrode of the PMOS is connected to the ground signal VS S, that is, the NMOS and the PMOS are in an on state, a drain electrode of the NMOS and a drain electrode of the PMOS are connected to form the input terminal of the transmission gate, and a source electrode of the NMOS and a source electrode of the PMOS are connected to form the output terminal of the transmission gate.

Figure 3:
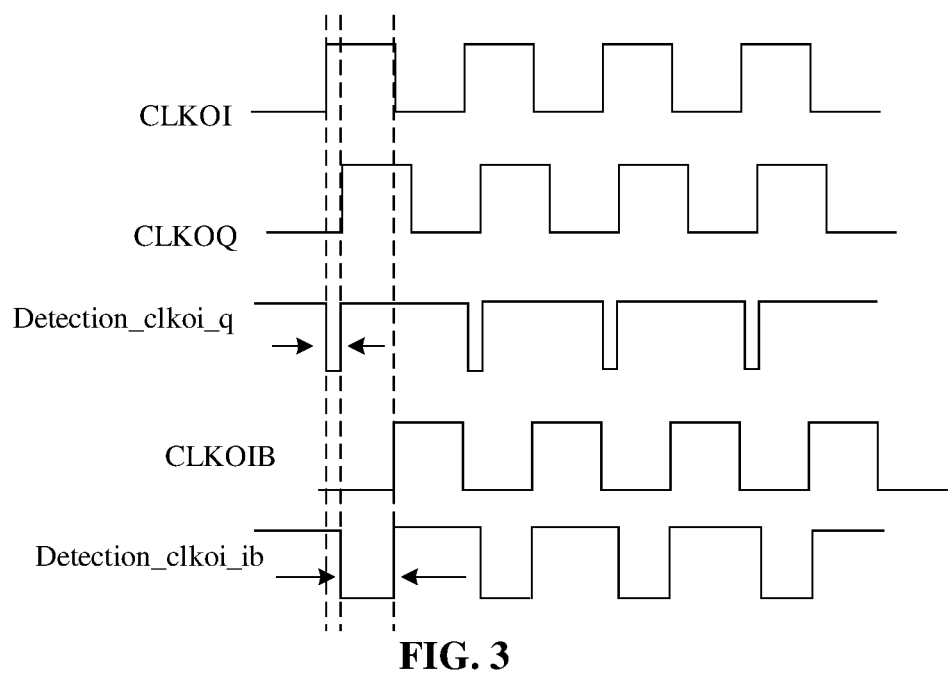
FIG. 3 is a signal timing diagram according to an embodiment of the present disclosure.

It is to be noted that based on FIG. 2, FIG. 3 shows a diagram of signal timing according to an embodiment of the present disclosure. As shown in FIG. 3, in the part between the rising edge of the first clock signal CLKOI and the rising edge of the second clock signal CLKOQ, the first detection signal Detection_clkoi_q is in a low level state. In the part between the rising edge of the second clock signal CLKOQ and the falling edge of the first clock signal CLKOI, the second detection signal Detection_clkoi_ib is in the low level state. It should be understood that the falling edge of the first clock signal CLKOI is coincident with the rising edge of the third clock signal CLKOIB.

It should be understood that the circuit structure shown in FIG. 2 is only a specific embodiment of the detection module 11. Due to the diversity of circuit elements, the detection module 11 may also adopt other circuit structures on the premise that phase difference information may be obtained. For example, the detection module 11 may only include the first NAND gate and the second NAND gate. The first NAND gate is configured to perform NAND operation of the first clock signal CLKOI and the fourth clock signal CLKOQB to obtain the first detection signal Detection_clkoi_q. The second NAND gate is configured to perform NAND operation of the first clock signal CLKOI and the second clock signal CLKOQ to obtain the second detection signal Detection_clkoi_ib.

In this way, by means of the first detection signal Detection_clkoi_q and the second detection signal Detection_clkoi_ib, the phase difference between the first clock signal CLKOI and the second clock signal CLKOQ may be reflected for subsequent the phase adjustment.

Figure 4:
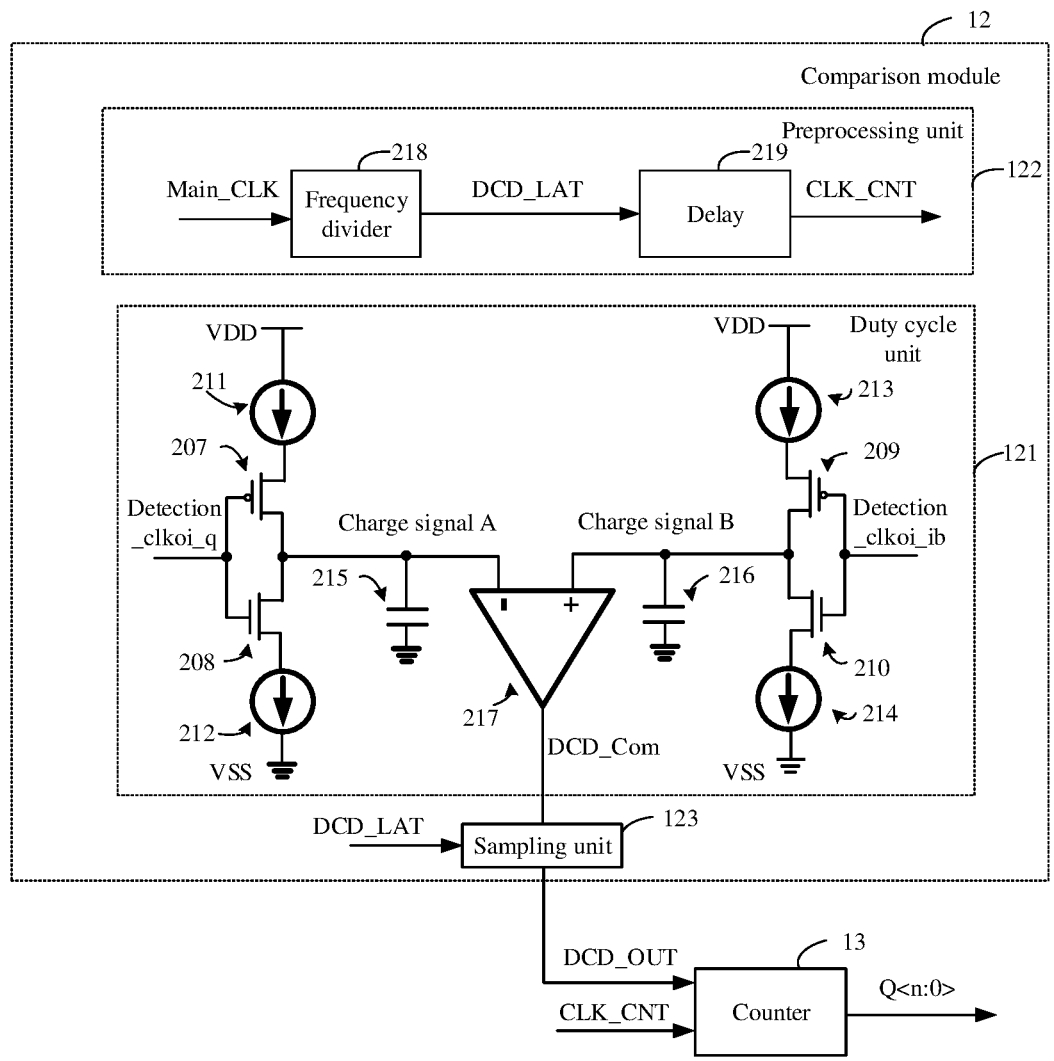
FIG. 4 is a second diagram of a partial structure of a phase adjusting circuit according to an embodiment of the present disclosure.

In some embodiments, as shown in FIG. 4, the comparison module 12 includes a duty cycle unit 121, a preprocessing unit 122 and a sampling unit 123.

The duty cycle unit 121 is configured to receive the first detection signal Detection_clkoi_q and the second detection signal Detection_clkoi_ib, and perform duty cycle comparison of the first detection signal Detection_clkoi_q and the second detection signal Detection_clkoi_ib to obtain a comparison result signal DCD_Com. Herein, when a duty cycle of the first detection signal Detection_clkoi_q is higher than a duty cycle of the second detection signal Detection_clkoi_ib, the comparison result signal DCD_Com is in a first level state. When the duty cycle of the first detection signal Detection_clkoi_q is lower than the duty cycle of the second detection signal Detection_clkoi_ib, the comparison result signal DCD_Com is in a second level state.

The preprocessing unit 122 is configured to receive a main clock signal Main CLK of the memory, and perform frequency division of the main clock signal Main CLK to obtain a sampling clock signal DCD_LAT.

The sampling unit 123 is configured to receive the sampling clock signal DCD_LAT and the comparison result signal DCD_Com, and perform sampling of the comparison result signal DCD_Com based on the sampling clock signal DCD_LAT to obtain the counting indication signal DCD_OUT.

Here, the first level state and the second level state are different, depending on the actual application scenario.

It is to be noted that if the duty cycle of the first detection signal Detection_clkoi_q is higher than the duty cycle of the second detection signal Detection_clkoi_ib, it may be considered that the phase difference between the second clock signal CLKOQ and the first clock signal CLKOI is less than 90 degrees, that is, the phase of the second clock signal CLKOQ needs to be adjusted backward. If the duty cycle of the first detection signal Detection_clkoi_q is lower than duty cycle of the second detection signal Detection_clkoi_ib, it may be considered that the phase difference between the second clock signal CLKOQ and the first clock signal CLKOI is greater than degrees, that is, the phase of the second clock signal CLKOQ needs to be adjusted forward. That is to say, the comparison result signal DCD_Com indicates a direction of phase adjustment of the second clock signal CLKOQ.

The sampling clock signal DCD_LAT is obtained by the frequency division of the main clock signal Main CLK, that is, a clock period of the sampling clock signal DCD_LAT is greater than a clock period of the main clock signal Main CLK, and the clock period of the sampling clock signal DCD_LAT is an integer multiple of the clock period of the main clock signal Main CLK. Here, the frequency division is to give sufficient response time to the sampling unit 123.

Taking the first level signal being a high level signal and the second level signal being a low level signal as an example, the specific structure of the duty cycle unit 121 is provided.

As shown in FIG. 4, the duty cycle unit 121 includes a first switch transistor 207, a second switch transistor 208, a third switch transistor 209, a fourth switch transistor 210, a first current source 211, a second current source 212, a third current source 213, a fourth current source 214, a first capacitor 215, a second capacitor 216, and an operational amplifier 217. Herein, a control terminal of the first switch transistor 207 and a control terminal of the second switch transistor 208 form a connection point configured to receive the first detection signal Detection_clkoi_q. A first terminal of the first switch transistor 207 is connected to an output terminal of the first current source 211, an input terminal of the first current source 211 is connected to the power supply signal VDD, a second terminal of the second switch transistor 208 is connected to an input terminal of the second current source 212, and an output terminal of the second current source 212 is connected to the ground signal VSS. A second terminal of the first switch transistor 207 and a first terminal of the second switch transistor 208 are both connected to a first terminal of the first capacitor 215, and a second terminal of the first capacitor 215 is connected to the ground signal VSS. A control terminal of the third switch transistor 209 and a control terminal of the fourth switch transistor 210 form a connection point configured to receive the second detection signal Detection_clkoi_ib. A first terminal of the third switch transistor 209 is connected to an output terminal of the third current source 213, an input terminal of the third current source 213 is connected to the power supply signal, a second terminal of the fourth switch transistor 210 is connected to an input terminal of the fourth current source 214, and an output terminal of the fourth current source 214 is connected to the ground signal. A second terminal of the third switch transistor 209 and a first terminal of the fourth switch transistor 210 are both connected to a first terminal of the second capacitor 216, and a second terminal of the second capacitor 216 is connected to the ground signal VSS. The first terminal of the first capacitor 215 is further connected to an inverting input terminal of the operational amplifier 217, the first terminal of the second capacitor 216 is further connected to a non-inverting input terminal of the operational amplifier 217, and an output terminal of the operational amplifier 217 is configured to output the comparison result signal DCD_Com.

As shown in FIG. 4, if the first detection signal Detection_clkoi_q is in a high level state, the first switch transistor 207 is turned off and the second switch transistor 208 is turned on, at this time, a first charging node Charge signal A, the second switch transistor 208, the second current source 212, and the ground signal VSS form a current path, that is, the first charging node Charge signal A discharges to the ground VSS. If the first detection signal Detection_clkoi_q is in a low level state, the first switch transistor 207 is turned on and the second switch transistor 208 is turned off, at this time, the power signal VDD, the first current source 211, the first switch transistor 207, and the first charging node Charge signal A form a current path, that is, the first charging node Charge signal A is charged by the power signal VDD. The rest may be understood by reference.

In this way, if the duty cycle of the first detection signal Detection_clkoi_q is higher than the duty cycle of the second detection signal Detection_clkoi_ib, a charging speed of the first capacitor 215 is less than a charging speed of the second capacitor 216, at this time, a voltage of the first charging node Charge signal A is less than a voltage of a second charging node Charge signal B, and the operational amplifier 217 is configured to output a high-level comparison result signal DCD_Com. If the duty cycle of the first detection signal Detection_clkoi_q is lower than the duty cycle of the second detection signal Detection_clkoi_ib, the charging speed of the first capacitor 215 is greater than the charging speed of the second capacitor 216, at this time, the voltage of the first charging node Charge signal A is greater than the voltage of the second charging node Charge signal B, and the operational amplifier 217 is configured to output a low-level comparison result signal DCD_Com.

It is to be noted that as shown in FIG. 4, the preprocessing unit 122 may include a frequency divider 218, configured to perform the frequency division of the main clock signal Main CLK to obtain the sampling clock signal DCD_LAT. The frequency divider 218 may be a conventional frequency division circuit. In addition, the sampling unit 123 may be implemented by a D Flip Flop (DFF).

In some embodiments, the preprocessing unit 122 is further configured to delay the sampling clock signal DCD_LAT to obtain the preset counting clock signal CLK_CNT. Exemplarily, as shown in FIG. 4, the preprocessing unit 122 further includes a delay 219, configured to delay the sampling clock signal DCD_LAT to obtain the preset counting clock signal CLK_CNT. Besides, the preset counting clock signal CLK_CNT may also be directly obtained by the frequency division of the main clock signal Main CLK.

Figure 5:
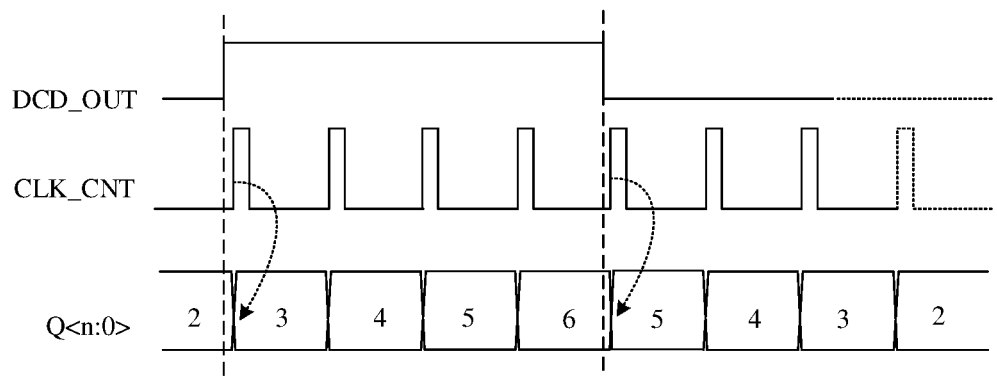
FIG. 5 is another signal timing diagram according to an embodiment of the present disclosure.

As shown in FIG. 5, the counting module 13 is configured to add one to the count value Q<n:0> every time one pulse of the preset counting clock signal CLK_CNT is detected in a case that the counting indication signal DCD_OUT is in the first level state (taking the high level state as an example in FIG. 5); or, subtract one from the count value Q<n:0> every time one pulse of the preset counting clock signal CLK_CNT is detected in a case that the counting indication signal DCD_OUT is in the second level state (taking the low level state as an example in FIG. 5). Here, the counting module 13 may adopt a conventional counter structure.

That is, a change direction of the count value Q<n:0> may be determined based on the counting indication signal DCD_OUT. Taking the circuits shown in FIG. 2 to FIG. 5 as an example, the larger the count value Q<n:0> is, the smaller the phase difference between the first clock signal CLKOI and the second clock signal CLKOQ is, and the phase of the second clock signal CLKOQ needs to be adjusted backward. The smaller the count value Q<n:0> is, the larger the phase difference between the first clock signal CLKOI and the second clock signal CLKOQ is, the phase of the second clock signal CLKOQ needs to be adjusted forward, so that the first clock signal CLKOI and the second clock signal CLKOQ maintain the phase difference of 90 degrees.

In some embodiments, when the counting indication signal DCD_OUT produces a state transition (jumping from the first level state to the second level state, or jumping from the second level state to the first level state), it indicates that the phase difference between the first clock signal and the second clock signal (as well as the third clock signal and the fourth clock signal) has met the requirements, and the count value is latched to maintain the state of the clock signal.

Figure 6:
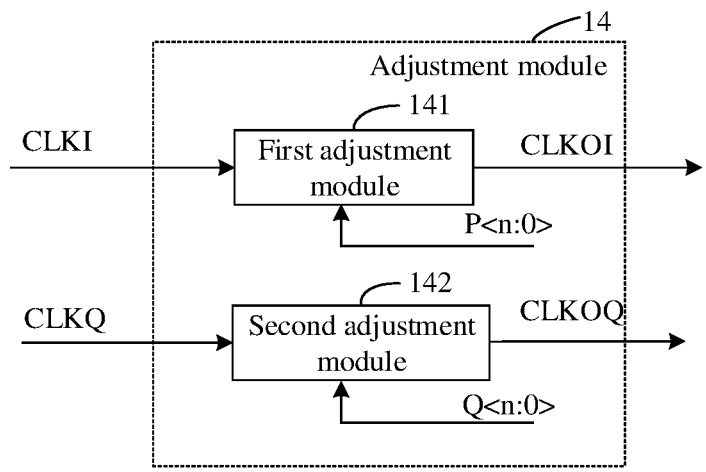
FIG. 6 is a third diagram of a partial structure of a phase adjusting circuit according to an embodiment of the present disclosure.

In one embodiment, only the first clock signal CLKOI and the second clock signal CLKOQ are considered. As shown in FIG. 6, the adjustment module 14 may include a first adjustment module 141 and a second adjustment module 142.

The first adjustment module 141 is configured to receive a preset fixed value P<n:0> and a first original clock signal CLKI, and perform transmission of the first original clock signal CLKI based on the preset fixed value P<n:0> to obtain the first clock signal CLKOI.

The second adjustment module 142 is configured to receive the count value Q<n:0> and a second original clock signal CLKQ, and perform transmission of the second original clock signal CLKQ based on the count value Q<n:0> to obtain the second clock signal CLKOQ.

Here, shapes of the first original clock signal CLKI and the first clock signal CLKOI are the same, but there is a certain transmission delay between the first original clock signal CLKI and the first clock signal CLKOI; and shapes of the second original clock signal CLKQ and the second clock signal CLKOQ are the same, but there is a certain transmission delay between the second original clock signal CLKQ and the second clock signal CLKOQ.

It is to be noted that the preset fixed value P<n:0> should be greater than a minimum value that the count value Q<n:0> may take, and less than a maximum value that the count value Q<n:0> may take, so as to avoid phase adjustment in only one direction.

In a case that the count value Q<n:0> is greater than the preset fixed value P<n:0>, the rising edge of the second clock signal CLKOQ moves in a first direction relative to the rising edge of the first clock signal CLKOI. In a case that the count value Q<n:0> is less than the preset fixed value P<n:0>, the rising edge of the second clock signal CLKOQ moves in a second direction relative to the rising edge of the first clock signal CLKOI. Here, the first direction and the second direction are opposite, which may be specifically determined according to the actual application scenario.

Figure 7:
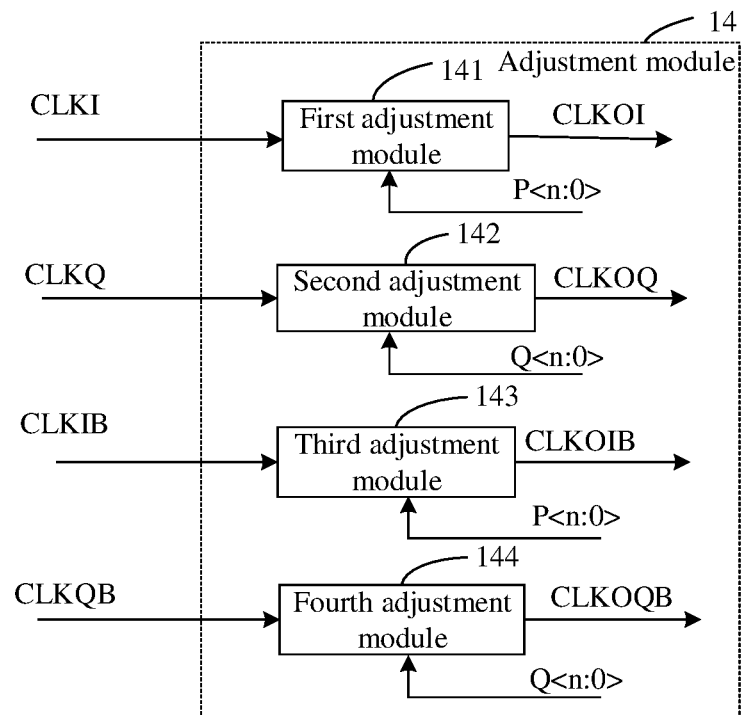
FIG. 7 is a fourth diagram of a partial structure of a phase adjusting circuit according to an embodiment of the present disclosure.

In another embodiment, if the first clock signal CLKOI, the second clock signal CLKOQ, the third clock signal CLKOIB and the fourth clock signal CLKOQB are considered, as shown in FIG. 7, the adjustment module 14 further includes a third adjustment module 143 and a fourth adjustment module 144.

The third adjustment module 143 is configured to receive the preset fixed value P<n:0> and a third original clock signal CLKIB, and perform transmission of the third original clock signal CLKIB based on the preset fixed value P<n:0> to obtain the third clock signal CLKOIB. A phase difference between the third original clock signal CLKIB and the first original clock signal CLKI is 180 degrees.

The fourth adjustment module 144 is configured to receive the count value Q<n:0> and a fourth original clock signal CLKQB, and perform transmission of the fourth original clock signal CLKQB based on the count value Q<n:0> to obtain the fourth clock signal CLKOQB. A phase difference between the fourth original clock signal CLKQB and the second original clock signal CLKIB is 180 degrees.

Similarly, in a case that the count value Q<n:0> is greater than the preset fixed value P<n:0>, the rising edge of the fourth clock signal CLKOQB moves in the first direction relative to the rising edge of the third clock signal CLKOIB. In a case that the count value Q<n:0> is less than the preset fixed value P<n:0>, the rising edge of the fourth clock signal CLKOQB moves in the second direction relative to the rising edge of the third clock signal CLKOIB.

In the embodiment of the present disclosure, the first adjustment module 141, the second adjustment module 142, the third adjustment module 143, and the fourth adjustment module 144 all adopt the same circuit structure.

Figure 8:
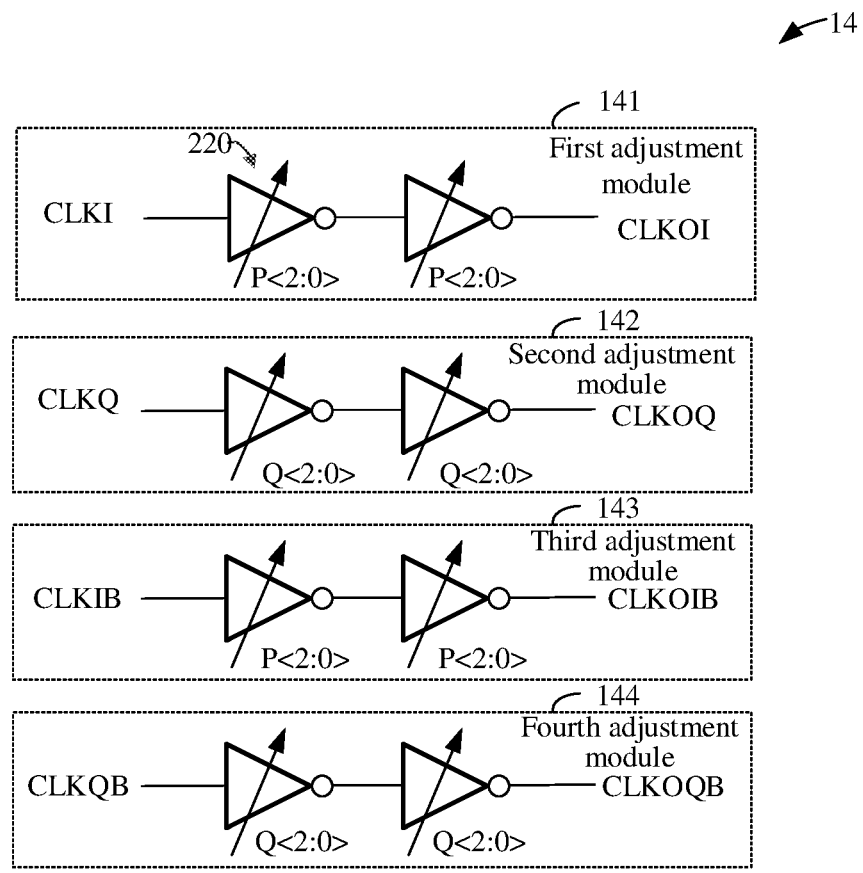
FIG. 8 is a fifth diagram of a partial structure of a phase adjusting circuit according to an embodiment of the present disclosure.

Exemplarily, as shown in FIG. 8, each of the first adjustment module 141, the second adjustment module 142, the third adjustment module 143, and the fourth adjustment module 144 includes a preset number of adjustment units 220 (only one adjustment unit is labeled in FIG. 8) It should be understood that in FIG. 8, the adjustment unit is implemented by an adjustable NOT gate. That is, for each adjustment unit, the output signal of the adjustment unit is inverted in phase with respect to the input signal of the adjustment unit. Therefore, the preset number should be an even number.

An example of the specific structure of the adjustment unit 220 is provided below.

Figure 9:
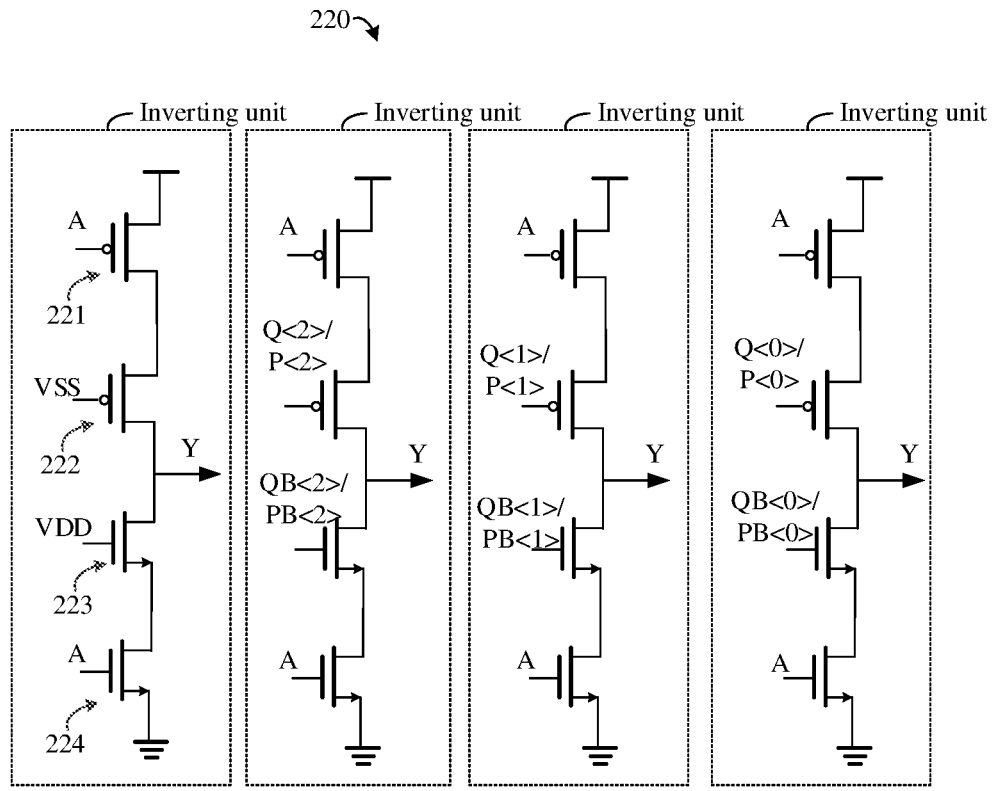
FIG. 9 is a sixth diagram of a partial structure of a phase adjusting circuit according to an embodiment of the present disclosure.

As shown in FIG. 9, in some embodiments, the adjustment unit 220 includes a plurality of inverting units (an example of 4 inverting units are shown in FIG. 9), and is configured to determine: whether each of the plurality of inverting units is turned on based on the preset fixed value P<n:0> or the count value Q<n:0>; and perform inverting transmission processing for a corresponding one of the first clock signal CLKOI, the second clock signal CLKOQ, the third clock signal CLKOIB and the fourth clock signal CLKOQB using the turned-on inverting unit.

It is to be noted that for the first adjustment module 141, the second adjustment module 142, the third adjustment module 143, and the fourth adjustment module 144, at least one of the plurality of inverting units in each adjustment unit is turned on. For each adjustment unit, control terminals of the plurality of the inverting units together form a control terminal of the adjustment unit, and a control terminal of one of the plurality of inverting units is configured to receive one of bits of the count value or one of bits of the fixed value; input terminals of the plurality of inverting units together form an input terminal of the adjusting unit, which is configured to receive an input signal A; and output terminals of the plurality of the inverting units together form an output terminal of the adjustment unit, which is configured to determine an output signal Y.

Here, if more inverting units are turned on, the signal transmission speed of the adjustment unit 220 is faster, and the rising edge of the output signal of the adjustment unit 220 is adjusted forward. If fewer inverting units are turned on, the signal transmission speed of the adjustment unit 220 is slower, and the rising edge of the output signal of the adjustment unit 220 is adjusted backward.

It is to be noted that if the adjustment unit 220 is located in the first adjustment module 141, the input signal A is the first original clock signal CLKI, and the output signal Y is the first clock signal CLKOI. If the adjustment unit 220 is located in the second adjustment module 142, the input signal A is the second original clock signal CLKQ, and the output signal Y is the second clock signal CLKOQ. If the adjustment unit 220 is located in the third adjustment module 143, the input signal A is the third original clock signal CLKIB, and the output signal Y is the third clock signal CLKOIB. If the adjustment unit 220 is located in the fourth adjustment module 144, the input signal A is the fourth original clock signal CLKQB, and the output signal Y is the fourth clock signal CLKOQB.

In some embodiments, the number of the bits of the preset fixed value and the number of the bits of the count value are identical, and both are n. The adjustment unit includes (n+1) inverting units, and the first inverting unit is always in an on state. If the adjustment unit 220 belongs to the first adjustment module 141 or the third adjustment module 143, whether the (i+1)-th inverting unit is turned on depends on the i-th bit of the preset fixed value. If the adjustment unit 220 belongs to the second adjustment module 142 or the fourth adjustment module 144, whether the (i+1)-th inverting unit is turned on depends on the i-th bit of the count value. Herein, n is a positive integer, i is a positive integer, and i is less than or equal to n.

Taking n=3 as an example to illustrate in detail, in this case, the count value may be expressed as Q<2:0>, and the preset fixed value is P<2:0>. As shown in FIG. 9, the adjustment unit 220 includes four inverting units, and the first inverting unit is always turned on. Herein, (1) if the adjustment unit 220 is located in the first adjustment module 141 or the third adjustment module 143, whether the second inverting unit is turned on depends on P<2> (the first bit in P<2:0>, and others may be understood by reference), whether the third inverting unit is turned on depends on P<1>, and whether the fourth inverting unit is turned on depends on P<0>. (2) If the adjustment unit 220 is located in the second adjustment module 142 or the fourth adjustment module 144, whether the second inverting unit is turned on depends on Q<2>, whether the third inverting unit is turned on depends on Q<1>, and whether the 4th inverting unit is turned on depends on Q<0>.

It is also to be noted that the signal transmission capabilities of different inverting units may be the same or different, so as to provide more delay amplitudes to adapt to different situations.

In some embodiments, as shown in FIG. 9, each of the inverting units (only devices in one inverting unit are labeled in FIG. 9) includes a fifth switch transistor 221, a sixth switch transistor 222, a seventh switch transistor 223, and an eighth switch transistor 224. A first terminal of the fifth switch transistor 221 is connected to the power supply signal, a second terminal of the fifth switch transistor 221 is connected to a first terminal of the sixth switch transistor 222, a second terminal of the seventh switch transistor 223 is connected to a first terminal of the eighth switch transistor 224, and a second terminal of the eighth switch transistor 224 is connected to the ground signal VSS. In the first inverting unit, a control terminal of the sixth switch transistor 222 is connected to the ground signal VSS, and a control terminal of the seventh switch transistor 223 is connected to the power supply signal, so that the first inverting unit is always in the on state. In the (i+1)-th inverting unit, the control terminal of the sixth switch transistor 222 is connected to the i-th control signal (such as Q<2>, Q<1>, Q<0>, P<2>, P<1> or P<0>), the control terminal of the seventh switch transistor is connected to an inverted signal (such as QB<2>, QB<1>, QB<0>, PB<2>, PB<1> or PB<0>) of the i-th control signal, and a level state of the i-th control signal depends on the i-th bit of the count value or the i-th bit of the preset fixed value, so that whether the (i+1)-th inverting unit is turned on depends on the i-th bit of the count value or the i-th bit of the preset fixed value. A control terminal of the fifth switch transistor 221 and a control terminal of the eighth switch transistor 224 together form an input terminal of the inverting unit, and a second terminal of the sixth switch transistor 222 and a first terminal of the seventh switch transistor 223 together form an output terminal of the inverting unit.

Figure 10:
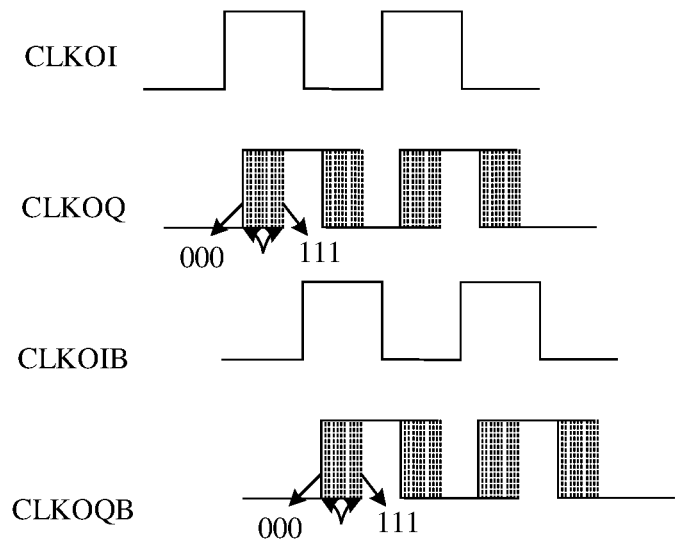
FIG. 10 is still another signal timing diagram according to an embodiment of the present disclosure.

In a specific embodiment, it is set the preset fixed value P<2:0>=100. As shown in FIG. 9 and FIG. 10, in the first adjustment module 141 and the third adjustment module 143, the first inverting unit, the third inverting unit, and the fourth inverting unit are always turned on, and the second inverting unit is always turned off. In this case, if Q<2:0>=111, it means that in the second adjustment module 142 and the fourth adjustment module 144, all the inverting units are turned off, that is, the second adjustment module 142 and the fourth adjustment module 144 perform signal transmission at a slower speed. At this time, the rising edges of the second clock signal CLKOQ and the fourth clock signal CLKOQB move backward, that is, the phase difference between the first clock signal CLKOI and the second clock signal CLKOQ, and the phase difference between the third clock signal CLKOIB and the fourth clock signal CLKOQB are increased. If Q<2:0>=000, it means that in the second adjustment module 142 and the fourth adjustment module 144, all the inverting units are turned on, that is, the second adjustment module 142 and the fourth adjustment module 144 perform signal transmission at a faster speed. At this time, the rising edges of the second clock signal CLKOQ and the fourth clock signal CLKOQB move forward, that is, the phase difference between the first clock signal CLKOI and the second clock signal CLKOQ, and the phase difference between the third clock signal CLKOIB and the fourth clock signal CLKOQB are reduced.

In the above description, the first level state is the high level state, and the second level state is the low level state. Each of the first switch transistor 207, the third switch transistor 209, the fifth switch transistor 221, and the sixth switch transistor 222 is a P-channel field effect transistor; and each of the second switch transistor 208, the fourth switch transistor 210, the seventh switch transistor 223, and the eighth switch transistor 224 is an N-channel field effect transistor. A control terminal of the P-channel field effect transistor is a gate electrode, a first terminal of the P-channel field effect transistor is a source electrode, and a second terminal of the P-channel field effect transistor is a drain electrode. A control terminal of the N-channel field effect transistor is a gate electrode, a first terminal of the N-channel field effect transistor is a drain electrode, and a second terminal of the N-channel field effect transistor is a source electrode. In addition, the actual voltage of the aforementioned power supply signal VDD depends on the actual application scenario.

In addition, FIG. 2, FIG. 4, FIG. 8, and FIG. 9 are all feasible examples in the embodiments of the present disclosure, and do not constitute specific limitations to the present disclosure. Other circuit structures may be adopted on the premise that the corresponding functions may be realized.

To sum up, the embodiments of the present disclosure provide a phase adjusting circuit, which may, by detecting the phase difference between different clock signals and correcting the clock signals, improve the phase skew between the clock signals, thereby improving the performance of the semiconductor.

In another embodiment of the present disclosure, a delay locking circuit is provided. The delay locking circuit is configured to output a first clock signal, a second clock signal, a third clock signal, and a fourth clock signal.

Figure 11:
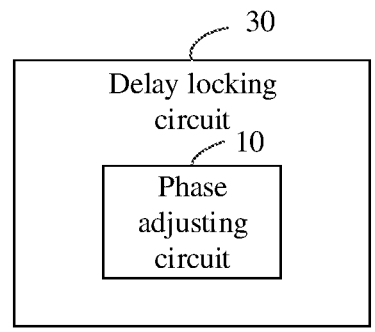
FIG. 11 is a structural diagram of a delay locking circuit according to an embodiment of the present disclosure.

Referring to FIG. 11, which shows a structural diagram of a delay locking circuit according to an embodiment of the present disclosure. As shown in FIG. 11, the delay locking circuit 30 includes at least the phase adjusting circuit 10 as described above. The delay locking circuit 30 is configured to correct phase differences between the first clock signal, the second clock signal, the third clock signal, and the fourth clock signal through the phase adjusting circuit 10, so that the first clock signal, the second clock signal, the third clock signal, and the fourth clock signal differ in phase by 90 degrees in sequence.

It is to be noted that the delay locking circuit 30 may also be called a DLL, and is applied to a memory. In this way, the phase adjusting circuit 10 may cancel the phase skew between different clock channels in the delay locking circuit 30, so as to avoid the problems of mismatch and noise and improve the accuracy of subsequent data sampling or other processing, thereby improving the performance of the memory.

Figure 12:
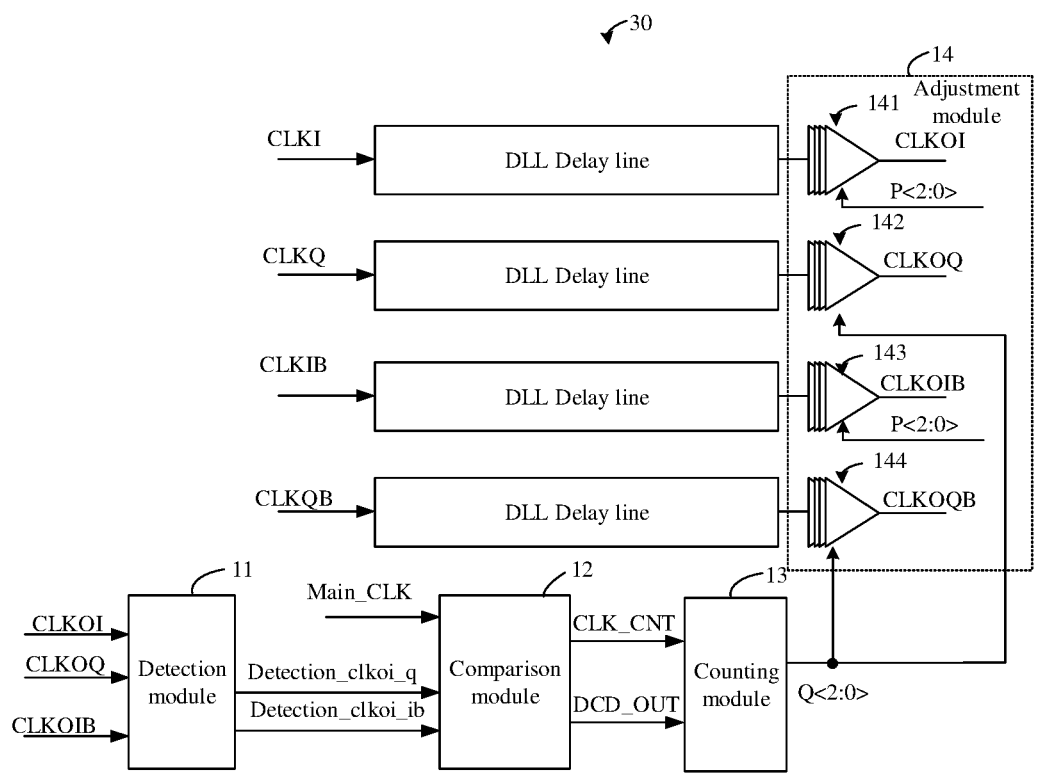
FIG. 12 is a specific structural diagram of a delay locking circuit according to an embodiment of the present disclosure.

Referring to FIG. 12, a specific structure of a delay locking circuit 30 is provided below.

As shown in FIG. 12, the delay locking circuit 30 is configured to receive four-phase clock input signals (the first original clock signal CLKI, the second original clock signal CLKQ, the third original clock signal CLKIB, and the fourth original clock signal CLKIB), and output four-phase clock output signals (the first clock signal CLKOI, the second clock signal CLKOQ, the third clock signal CLKIOB, and the fourth clock signal CLKIOB).

The delay locking circuit 30 includes four DLL Delay lines and the phase adjusting circuit 10. Herein, the four DLL Delay lines are configured to perform transmission processing of the CLKI, CLKQ, CLKIB, and CLKIB respectively, and the phase adjusting circuit 10 is configured to detect and correct phase skew between the four-phase clock output signals (CLKOI, CLKOQ, CLKIOB, and CLKIOB) to ensure that the phases of the four-phase clock output signals (CLKOI, CLKOQ, CLKIOB, and CLKIOB) differ by 90 degrees in sequence.

Specifically, the phase adjusting circuit 10 includes the detection module 11, the comparison module 12, the counting module 13 and the adjustment module 14.

(1) With reference to the aforementioned FIG. 2 and FIG. 3, the detection module 11 is configured to determine phase difference information between the four-phase clock output signals. Specifically, the detection module 11 is configured to compare the rising edge of the first clock signal CLKOI with the rising edge of the second clock signal CLKOQ to obtain the first detection signal Detection_clkoi_q. At the same time, the detection module 11 is configured to compare the rising edge of the second clock signal CLKOQ with the falling edges of the first clock signal CLKOI to output the second detection signal Detection_clkoi_ib.

(2) With reference to the aforementioned FIG. 4, the comparison module 12 is configured to: determine the duty cycle of the first detection signal Detection_clkoi_q and the duty cycle of the second detection signal Detection_clkoi_ib; output, if the duty cycle of the first detection signal Detection_clkoi_q is greater than the duty cycle of the second detection signal Detection_clkoi_ib, the comparison result signal DCD_Com in the high level state; or output, if the duty cycle of the first detection signal Detection_clkoi_q is less than the duty cycle of the second detection signal Detection_clkoi_ib, the comparison result signal DCD_Com in the low level state. Moreover, the main clock signal Main CLK of the memory is subjected to the frequency division to obtain the sampling clock signal DCD_LAT, and the comparison result DCD_Com signal is sampled using the sampling clock signal DCD_LAT to obtain the counting indication signal DCD_OUT. Here, the sampling clock signal DCD_LAT obtained by the frequency division may leave sufficient response time for the comparison module 12.

(3) With reference to the aforementioned FIG. 4 and FIG. 5, the counting module 13 is configured to count the preset counting clock signal CLK_CNT based on the counting indication signal DCD_OUT to obtain the count value Q<2:0>. Here, the preset counting clock signal CLK_CNT is obtained by delaying the sampling clock signal DCD_LAT, and the counting indication signal DCD_OUT may characterize the change direction of the count value Q<2:0>. As shown in FIG. 5, if the counting indication signal DCD_OUT is at a high level, the count value Q<2:0> is increased gradually. If the counting indication signal DCD_OUT is at a low level, the count value Q<2:0> is decreased gradually.

(4) With reference to the aforementioned FIGS. 7 to 9, the adjustment module 14 includes the first adjustment module 141, the second adjustment module 142, the third adjustment module 143, and the fourth adjustment module 144, which are arranged at output terminals of the four DLL Delay lines, respectively. The control terminal of the first adjustment module 141 is configured to receive the preset reference value P<2:0>=100, and perform transmission of an output signal of the first DLL Delay line (corresponding to CLKI) with a fixed delay to obtain the first clock signal CLKOI. The control terminal of the second adjustment module 142 is configured to receive the count value Q<2:0>, and perform transmission of an output signal of the second DLL Delay line (corresponding to CLKQ) with a corresponding delay to obtain the second clock signal CLKOQ. The control terminal of the third adjustment module 143 is configured to receive the preset reference value P<2:0>=100, and perform transmission of an output signal of the third DLL Delay line (corresponding to CLKIB) with the fixed delay to obtain the third clock signal CLKOIB. The control terminal of the fourth adjustment module 144 is configured to receive the count value Q<2:0>, and perform transmission of an output signal of the fourth DLL Delay line (corresponding to CLKQB) with a corresponding delay to obtain the fourth clock signal CLKOQB. As shown in FIG. 10, if the count value Q<2:0> is larger, the signal edge of the second clock signal CLKOQ/fourth clock signal CLKOQB moves backward. If the count value Q<2:0> is smaller, the signal edge of the second clock signal CLKOQ/fourth clock signal CLKOQB moves forward.

That is to say, in the embodiment of the present disclosure, the preset fixed value is set to be P<2:0>=100 as a reference. Assuming that the phase difference between the first clock signal CLKOI and the second clock signal CLKOQ is less than 90 degrees, and the phase difference between the second clock signal CLKOQ and the third clock signal CLKOIB is greater than 90 degrees, in this case, the duty cycle of the first detection signal Detection_clkoi_q is higher than the duty cycle of the second detection signal Detection_clkoi_ib, the counting indication signal is in the high level state, and the count value is increased, thereby increasing the phase difference between the first clock signal CLKOI and the second clock signal CLKOQ while reducing the phase difference between the second clock signal CLKOQ and the third clock signal CLKOIB. Conversely, assuming that the phase difference between the first clock signal CLKOI and the second clock signal CLKOQ is greater than 90 degrees, and the phase difference between the second clock signal CLKOQ and the third clock signal CLKOIB is less than 90 degrees, in this case, the duty cycle of the first detection signal Detection_clkoi_q is lower than the duty cycle of the second detection signal Detection_clkoi_ib, the counting indication signal is in the low level state, and the count value is reduced, thereby reducing the phase difference between the first clock signal CLKOI and the second clock signal CLKOQ while increasing the phase difference between the second clock signal CLKOQ and the third clock signal CLKOIB. In this way, since the phase adjusting circuit 10 is added to the delay locking circuit which is also called the DLL, the phase differences between the four-phase clock signals may be adjusted, and it is ensured that the four-phase clock signals may differ in phase by 90 degrees in sequence within the error range, so as to avoid errors during subsequent sampling processing based on the four-phase clock signals, thereby ultimately improving the performance of the semiconductor.

The embodiments of the present disclosure provide a delay locking circuit, in which the phase adjusting circuit 10 is configured to detect the phase difference between different clock signals and corrects the clock signals, so as to improve the phase skew between the clock signals, and ensue that the first clock signal, the second clock signal, the third clock signal and the fourth clock signal differ in phase by 90 degrees in sequence within the error range, thereby improving the performance of the semiconductor.

Figure 13:
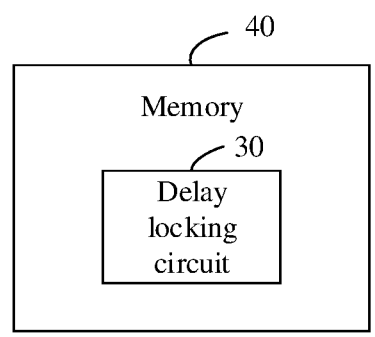
FIG. 13 is a structural diagram of a memory according to an embodiment of the present disclosure.

In another embodiment of the present disclosure, referring to FIG. 13, which shows a structural diagram of compositions of a memory 40 according to an embodiment of the present disclosure. As shown in FIG. 13, the memory 40 includes at least the delay locking circuit 30 as described above.

Since the delay locking circuit 30 is able to detect the phase difference between different clock signals and correct the clock signals through the phase adjusting circuit therein, so as to improve the phase skew between the clock signals, and ensure that the first clock signal, the second clock signal, the third clock signal, and the fourth clock signal differ in phase by 90 degrees in sequence within the error range, thereby improving the performance of the semiconductor.

In some examples, the terms "module" and "unit" and the like in the phase adjusting circuit 10 may be implemented by one or more hardware circuits and/or one or more processors. In some examples, a module or unit may include one or more circuits/sub-circuits with or without stored code or instructions. The module or unit may include one or more components that are directly or indirectly connected. These components may or may not be physically attached to, or located adjacent to, one another.

The above are only the preferred embodiments of the present disclosure, and are not intended to limit the scope of protection of the present disclosure. It is to be noted that in this disclosure, the terms "including/comprising", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element. The sequence numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiments. The features disclosed in several method or device embodiments provided in the present disclosure may be combined arbitrarily without conflict to obtain new method embodiments or device embodiments.

The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

The invention claimed is:

1. A phase adjusting circuit, comprising a detection circuit, a comparison circuit, a counter, and an adjustment circuit that are connected in sequence; wherein,
    the detection circuit is configured to detect a phase difference between a first clock signal and a second clock signal to obtain a first detection signal and a second detection signal;
    the comparison circuit is configured to perform duty cycle comparison of the first detection signal and the second detection signal to obtain a counting indication signal;
    the counter is configured to count a number of pulses of a preset counting clock signal based on the counting indication signal to obtain a count value; and
    the adjustment circuit is configured to perform phase adjustment of the second clock signal based on the count value, so that the phase difference between the first clock signal and the second clock signal is a preset value.

2. The phase adjusting circuit of claim 1, wherein,
    the detection circuit is configured to receive any three signals of the first clock signal, the second clock signal, a third clock signal and a fourth clock signal, and output the first detection signal and the second detection signal based on the received signals;
    wherein, a phase difference between the third clock signal and the first clock signal is 180 degrees, a phase difference between the fourth clock signal and the second clock signal is 180 degrees, the first detection signal indicates a phase difference between a rising edge of the first clock signal and a rising edge of the second clock signal, and the second detection signal indicates a phase difference between the rising edge of the second clock signal and a falling edge of the first clock signal.

3. The phase adjusting circuit of claim 2, wherein,
    the adjustment circuit is further configured to perform phase adjustment of the fourth clock signal based on the count value, so that a phase difference between the third clock signal and the fourth clock signal is the preset value.

4. The phase adjusting circuit of claim 2, wherein the detection circuit comprises a first detection sub-circuit and a second detection sub-circuit; wherein,
    the first detection sub-circuit is configured to receive the first clock signal and the second clock signal, and perform logical operation of the first clock signal and the second clock signal to obtain the first detection signal; and
    the second detection sub-circuit is configured to receive the third clock signal and the second clock signal, and perform logical operation of the third clock signal and the second clock signal to obtain the second detection signal.

5. The phase adjusting circuit of claim 4, wherein the first detection sub-circuit comprises a first inverter, a first transmission gate, and a first NAND gate; and the second detection sub-circuit comprises a second inverter, a second transmission gate, and a second NAND gate;

an input terminal of the first inverter is configured to receive the second clock signal, an input terminal of the first transmission gate is configured to receive the first clock signal, and two input terminals of the first NAND gate are connected to an output terminal of the first inverter and an output terminal of the first transmission gate respectively, and an output terminal of the first NAND gate is configured to output the first detection signal; and an input terminal of the second inverter is configured to receive the third clock signal, an input terminal of the second transmission gate is configured to receive the second clock signal, and two input terminals of the second NAND gate are connected to an output terminal of the second inverter and an output terminal of the second transmission gate respectively, and an output terminal of the second NAND gate is configured to output the second detection signal.

6. The phase adjusting circuit of claim 1, wherein the phase adjusting circuit is applied to a memory, and the comparison circuit comprises a duty cycle sub-circuit, a preprocessing sub-circuit, and a sampling sub-circuit; wherein, the duty cycle sub-circuit is configured to receive the first detection signal and the second detection signal, and perform duty cycle comparison of the first detection signal and the second detection signal to obtain a comparison result signal; wherein the comparison result signal is in a first level state in response to a duty cycle of the first detection signal being higher than a duty cycle of the second detection signal, or the comparison result signal is in a second level state in response to a duty cycle of the first detection signal being lower than a duty cycle of the second detection signal;

the preprocessing sub-circuit is configured to receive a main clock signal of the memory, and perform frequency division of the main clock signal to obtain a sampling clock signal; and the sampling sub-circuit is configured to receive the sampling clock signal and the comparison result signal, and perform sampling of the comparison result signal based on the sampling clock signal to obtain the counting indication signal.

7. The phase adjusting circuit of claim 6, wherein the duty cycle sub-circuit comprises a first switch transistor, a second switch transistor, a third switch transistor, a fourth switch transistor, a first current source, a second current source, a third current source, a fourth current source, a first capacitor, a second capacitor, and an operational amplifier; wherein, a control terminal of the first switch transistor and a control terminal of the second switch transistor form a connection point configured to receive the first detection signal; a first terminal of the first switch transistor is connected to an output terminal of the first current source, an input terminal of the first current source is connected to a power supply signal, a second terminal of the second switch transistor is connected to an input terminal of the second current source, and an output terminal of the second current source is connected to a ground signal; and a second terminal of the first switch transistor and a first terminal of the second switch transistor are both connected to a first terminal of the first capacitor, and a second terminal of the first capacitor is connected to the ground signal;

a control terminal of the third switch transistor and a control terminal of the fourth switch transistor form a connection point configured to receive the second detection signal; a first terminal of the third switch transistor is connected to an output terminal of the third current source, an input terminal of the third current source is connected to the power supply signal, a second terminal of the fourth switch transistor is connected to an input terminal of the fourth current source, and an output terminal of the fourth current source is connected to the ground signal; and a second terminal of the third switch transistor and a first terminal of the fourth switch transistor are both connected to a first terminal of the second capacitor, and a second terminal of the second capacitor is connected to the ground signal; and the first terminal of the first capacitor is further connected to an inverting input terminal of the operational amplifier, the first terminal of the second capacitor is further connected to a non-inverting input terminal of the operational amplifier, and an output terminal of the operational amplifier is configured to output the comparison result signal.

8. The phase adjusting circuit of claim 6, wherein, the preprocessing sub-circuit is further configured to delay the sampling clock signal to obtain the preset counting clock signal; and the counter is configured to add one to the count value every time one pulse of the preset counting clock signal is detected in a case that the counting indication signal is in the first level state; or, subtract one from the count value every time one pulse of the preset counting clock signal is detected in a case that the counting indication signal is in the second level state.

9. The phase adjusting circuit of claim 1, wherein the adjustment circuit comprises a first adjustment circuit and a second adjustment circuit; wherein, the first adjustment circuit is configured to receive a preset fixed value and a first original clock signal, and perform transmission of the first original clock signal based on the preset fixed value to obtain the first clock signal; and the second adjustment circuit is configured to receive the count value and a second original clock signal, and perform transmission of the second original clock signal based on the count value to obtain the second clock signal;

wherein, in a case that the count value is greater than the preset fixed value, a rising edge of the second clock signal moves in a first direction relative to a rising edge of the first clock signal; or in a case that the count value is less than the preset fixed value, a rising edge of the second clock signal moves in a second direction relative to a rising edge of the first clock signal.

10. The phase adjusting circuit of claim 9, wherein the adjustment circuit further comprises a third adjustment circuit and a fourth adjustment circuit; wherein, the third adjustment circuit is configured to receive the preset fixed value and a third original clock signal, and perform transmission of the third original clock signal based on the preset fixed value to obtain a third clock signal; wherein a phase difference between the third original clock signal and the first original clock signal is 180 degrees; and the fourth adjustment circuit is configured to receive the count value and a fourth original clock signal, and perform transmission of the fourth original clock signal based on the count value to obtain a fourth clock signal;

wherein a phase difference between the fourth original clock signal and the second original clock signal is 180 degrees;

wherein, in a case that the count value is greater than the preset fixed value, a rising edge of the fourth clock signal moves in the first direction relative to a rising edge of the third clock signal; or in a case that the count value is less than the preset fixed value, a rising edge of the fourth clock signal moves in the second direction relative to a rising edge of the third clock signal.

11. The phase adjusting circuit of claim 10, wherein each of the first adjustment circuit, the second adjustment circuit, the third adjustment circuit, and the fourth adjustment circuit comprises a preset number of adjustment sub-circuits, the preset number being an even number;

each of the adjustment sub-circuits comprises a plurality of inverting sub-circuits, and is configured to: determine whether each of the plurality of inverting sub-circuits is turned on based on the preset fixed value or the count value; and perform inverting transmission processing for a corresponding one of the first clock signal, the second clock signal, the third clock signal and the fourth clock signal using the turned-on inverting sub-circuit;

wherein, at least one of the plurality of inverting sub-circuits in each adjustment sub-circuit is turned on; control terminals of the plurality of the inverting sub-circuits together form a control terminal of the adjustment sub-circuit, and a control terminal of one of the plurality of inverting sub-circuits is configured to receive one of bits of the count value or one of bits of the preset fixed value; and input terminals of the plurality of inverting sub-circuits together form an input terminal of the adjusting sub-circuit, and output terminals of the plurality of the inverting sub-circuits together form an output terminal of the adjustment sub-circuit.

12. The phase adjusting circuit of claim 11, wherein a number of the bits of the preset fixed value and a number of the bits of the count value are identical, and both are n;

the adjustment sub-circuit comprises (n+1) inverting sub-circuits, and a first inverting sub-circuit is always in an on state;

when the adjustment sub-circuit belongs to the first adjustment circuit or the third adjustment circuit, whether an (i+1)-th inverting sub-circuit is turned on depends on an i-th bit of the preset fixed value;

when the adjustment sub-circuit belongs to the second adjustment circuit or the fourth adjustment circuit, whether the (i+1)-th inverting sub-circuit is turned on depends on an i-th bit of the count value;

wherein, n is a positive integer, i is a positive integer, and i is less than or equal to n.

13. The phase adjusting circuit of claim 12, wherein each of the inverting sub-circuits comprises a fifth switch transistor, a sixth switch transistor, a seventh switch transistor, and an eighth switch transistor;

a first terminal of the fifth switch transistor is connected to a power supply signal, a second terminal of the fifth switch transistor is connected to a first terminal of the sixth switch transistor, a second terminal of the seventh switch transistor is connected to a first terminal of the eighth switch transistor, and a second terminal of the eighth switch transistor is connected to a ground signal;

in the first inverting sub-circuit, a control terminal of the sixth switch transistor is connected to the ground signal, and a control terminal of the seventh switch transistor is connected to the power supply signal, so that the first inverting sub-circuit is always in the on state;

in the (i+1)-th inverting sub-circuit, the control terminal of the sixth switch transistor is connected to an i-th control signal, the control terminal of the seventh switch transistor is connected to an inverted signal of the i-th control signal, and a level state of the i-th control signal depends on the i-th bit of the count value or the i-th bit of the preset fixed value, so that whether the (i+1)-th inverting sub-circuit is turned on depends on the i-th bit of the count value or the i-th bit of the preset fixed value; and a control terminal of the fifth switch transistor and a control terminal of the eighth switch transistor together form an input terminal of the inverting sub-circuit, and a second terminal of the sixth switch transistor and a first terminal of the seventh switch transistor together form an output terminal of the inverting sub-circuit.

14. The phase adjusting circuit of claim 1, wherein the preset value is 90 degrees.

15. The phase adjusting circuit of claim 6, wherein the first level state is a high level state, and the second level state is a low level state.

16. The phase adjusting circuit of claim 7, wherein each of the first switch transistor and the third switch transistor is a P-channel field effect transistor, and each of the second switch transistor and the fourth switch transistor is an N-channel field effect transistor; and wherein a control terminal of the P-channel field effect transistor is a gate electrode, a first terminal of the P-channel field effect transistor is a source electrode, a second terminal of the P-channel field effect transistor is a drain electrode, a control terminal of the N-channel field effect transistor is a gate electrode, a first terminal of the N-channel field effect transistor is a drain electrode, and a second terminal of the N-channel field effect transistor is a source electrode.

17. The phase adjusting circuit of claim 13, wherein each of the fifth switch transistor and the sixth switch transistor is a P-channel field effect transistor, and each of the seventh switch transistor and the eighth switch transistor is an N-channel field effect transistor; and wherein a control terminal of the P-channel field effect transistor is a gate electrode, a first terminal of the P-channel field effect transistor is a source electrode, a second terminal of the P-channel field effect transistor is a drain electrode, a control terminal of the N-channel field effect transistor is a gate electrode, a first terminal of the N-channel field effect transistor is a drain electrode, and a second terminal of the N-channel field effect transistor is a source electrode.

18. A delay locking circuit, configured to output a first clock signal, a second clock signal, a third clock signal, and a fourth clock signal; wherein the delay locking circuit comprises at least the phase adjusting circuit of claim 1; wherein, the delay locking circuit is configured to correct phase differences between the first clock signal, the second clock signal, the third clock signal, and the fourth clock signal through the phase adjusting circuit, so that the first clock signal, the second clock signal, the third clock signal, and the fourth clock signal differ in phase by 90 degrees in sequence.

19. A memory, comprising at least the delay locking circuit of claim 18.

* * * * *